(12) United States Patent
Ai et al.

(10) Patent No.: US 11,315,958 B2
(45) Date of Patent: Apr. 26, 2022

(54) ARRAY SUBSTRATE AND METHOD OF MANUFACTURING SAME

(71) Applicant: Wuhan China Star Optoelectronics Technology Co., Ltd., Wuhan (CN)

(72) Inventors: Fei Ai, Wuhan (CN); Dewei Song, Wuhan (CN); Guoheng Yin, Wuhan (CN)

(73) Assignee: Wuhan China Star Optoelectronics Technology Co., Ltd., Wuhan (CN)

(*) Notice: Subject to any disclaimer, the term of this patent is extended or adjusted under 35 U.S.C. 154(b) by 0 days.

(21) Appl. No.: 16/605,417

(22) PCT Filed: Sep. 18, 2019

(86) PCT No.: PCT/CN2019/106316
§ 371 (c)(1),
(2) Date: Oct. 15, 2019

(87) PCT Pub. No.: WO2020/232926
PCT Pub. Date: Nov. 26, 2020

(65) Prior Publication Data
US 2022/0059578 A1 Feb. 24, 2022

(30) Foreign Application Priority Data
May 17, 2019 (CN) .......................... 201910415368.7

(51) Int. Cl.
*H01L 27/12* (2006.01)
*H01L 29/786* (2006.01)
(Continued)

(52) U.S. Cl.
CPC ........ *H01L 27/1248* (2013.01); *H01L 27/124* (2013.01); *H01L 27/127* (2013.01); *H01L 27/1222* (2013.01); *H01L 27/1288* (2013.01); *H01L 29/66757* (2013.01); *H01L 29/78633* (2013.01); *H01L 29/78675* (2013.01); *G02F 1/1368* (2013.01)

(58) Field of Classification Search
CPC ............. H01L 27/1248; H01L 27/1222; H01L 27/124; H01L 27/127; H01L 27/1288; H01L 29/66757; H01L 29/78633; H01L 29/78675; G02F 1/1368
See application file for complete search history.

(56) References Cited

U.S. PATENT DOCUMENTS

2009/0195723 A1 8/2009 Araki
2017/0307920 A1 10/2017 Chung et al.
(Continued)

FOREIGN PATENT DOCUMENTS

CN 106547146 A 3/2017
CN 107315292 A 11/2017
(Continued)

*Primary Examiner* — Mohammed R Alam
(74) *Attorney, Agent, or Firm* — Nathan & Associates; Menachem Nathan

(57) ABSTRACT

An array substrate and a method of manufacturing the same are provided. The array substrate includes a substrate, a plurality of thin film transistors disposed on the substrate, and a planarization layer covering the plurality of thin film transistors and filled a region defined by the plurality of thin film transistors and the substrate.

11 Claims, 8 Drawing Sheets

(51) Int. Cl.
*H01L 29/66* (2006.01)
*G02F 1/1368* (2006.01)

(56) References Cited

U.S. PATENT DOCUMENTS

2017/0315395 A1   11/2017  Yeh
2018/0286888 A1*  10/2018  Yamaguchi ........... H01L 29/517
2018/0374879 A1   12/2018  Jeon et al.
2020/0174330 A1    6/2020  Hsu et al.
2020/0194526 A1*   6/2020  Zhang ................. H01L 27/3258

FOREIGN PATENT DOCUMENTS

| | | |
|---|---|---|
| CN | 107340934 A | 11/2017 |
| CN | 107479265 A | 12/2017 |
| CN | 109300848 A | 2/2019 |
| CN | 110190067 A | 8/2019 |

* cited by examiner

ARRAY SUBSTRATE AND METHOD OF MANUFACTURING SAME

FIELD OF INVENTION

The present disclosure relates to display technologies, and more particularly, to an array substrate and a method of manufacturing the same.

BACKGROUND OF INVENTION

Liquid crystal display (LCD) is the mainstream of displays, but its light utilization rate has not been easy to improve for a long time, and its light transmittance is limited.

Low temperature poly-Silicon (LTPS) technologies are used to fabricate a channel of a thin film transistor. Because of its high carrier mobility, a higher current can be obtained, which can reduce the size of the thin film transistor and increase the transmittance area of each sub-pixel, but increase of light transmittance is still limited.

Therefore, there is a need to solve the above problems.

SUMMARY OF INVENTION

In view of the above, the present disclosure provides a array substrate and a method of manufacturing the same to resolve above-mentioned technical problem.

In order to achieve above-mentioned object of the present disclosure, one embodiment of the disclosure provides an array substrate including a substrate, a plurality of thin film transistors disposed on the substrate, and a planarization layer covering the plurality of thin film transistors and filled a region defined by the plurality of thin film transistors and the substrate.

In one embodiment of the disclosure, the plurality of thin film transistors include a molybdenum shading layer disposed on the substrate, a buffer layer covering on the molybdenum shading layer, an active layer disposed on the buffer layer, a gate insulating layer covering on the active layer, a patterned gate layer disposed on the gate insulating layer, an interlayer dielectric covering on the patterned gate layer, and a source/drain layer disposed on the interlayer dielectric and connected to the active layer by a first through-hole layer.

In one embodiment of the disclosure, the array substrate further includes a transparent common conductive layer disposed on the planarization layer, a passivation layer disposed on the transparent common conductive layer, and transparent pixel electrodes disposed on the passivation layer.

In one embodiment of the disclosure, the array substrate further includes a patterned metallic layer and an insulating layer disposed between the planarization layer and the transparent common conductive layer.

In one embodiment of the disclosure, the active layer includes a poly-silicon layer, light doping layers disposed at opposite sides of the poly-silicon layer, and heavy doping layers contacted the light doping layers.

Furthermore, another embodiment of the disclosure provides a method of manufacturing an array substrate including steps of:

providing an array substrate with a source/drain layer;

providing a patterned photoresist layer covering the array substrate by half tone photo mask developing process;

etching the source/drain layer;

etching an interlayer dielectric, a gate insulating layer, and a buffer layer;

ashing the patterned photoresist layer;

etching the source/drain layer second time to form a patterned source/drain layer; and providing a planarization layer covering on the substrate.

In one embodiment of the disclosure, the method of manufacturing the array substrate further includes:

providing a transparent common conductive layer disposed on the planarization layer;

providing a passivation layer disposed on the transparent common conductive layer; and providing a transparent pixel electrode disposed on the passivation layer.

In one embodiment of the disclosure, the step of providing an array substrate with a source/drain layer further includes steps of:

providing a substrate;

providing a patterned molybdenum shading layer disposed on the substrate;

providing the buffer layer disposed on the patterned molybdenum shading layer;

providing a patterned active layer disposed on the buffer layer;

providing the gate insulating layer covering the patterned active layer;

providing a patterned gate layer disposed on the gate insulating layer;

providing the interlayer dielectric covering on the patterned gate layer;

and providing the source/drain layer disposed on the interlayer dielectric.

In one embodiment of the disclosure, the patterned active layer includes poly-silicon.

In one embodiment of the disclosure, the patterned active layer includes a poly-silicon layer, light doping layers disposed at opposite sides of the poly-silicon layer, and heavy doping layers disposed beside the light doping layers respectively.

In comparison with prior art, the array substrate and the method of manufacturing the same of the disclosure reduce light absorption, reflection, refraction, or scattering between layers and increase light transmittance by filling planarization layer in the region defined by the thin film transistors and the substrate after excavating the buffer layer, the gate insulating layer, and the interlayer dielectric between the thin film transistors and the substrate.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

Figure 1:
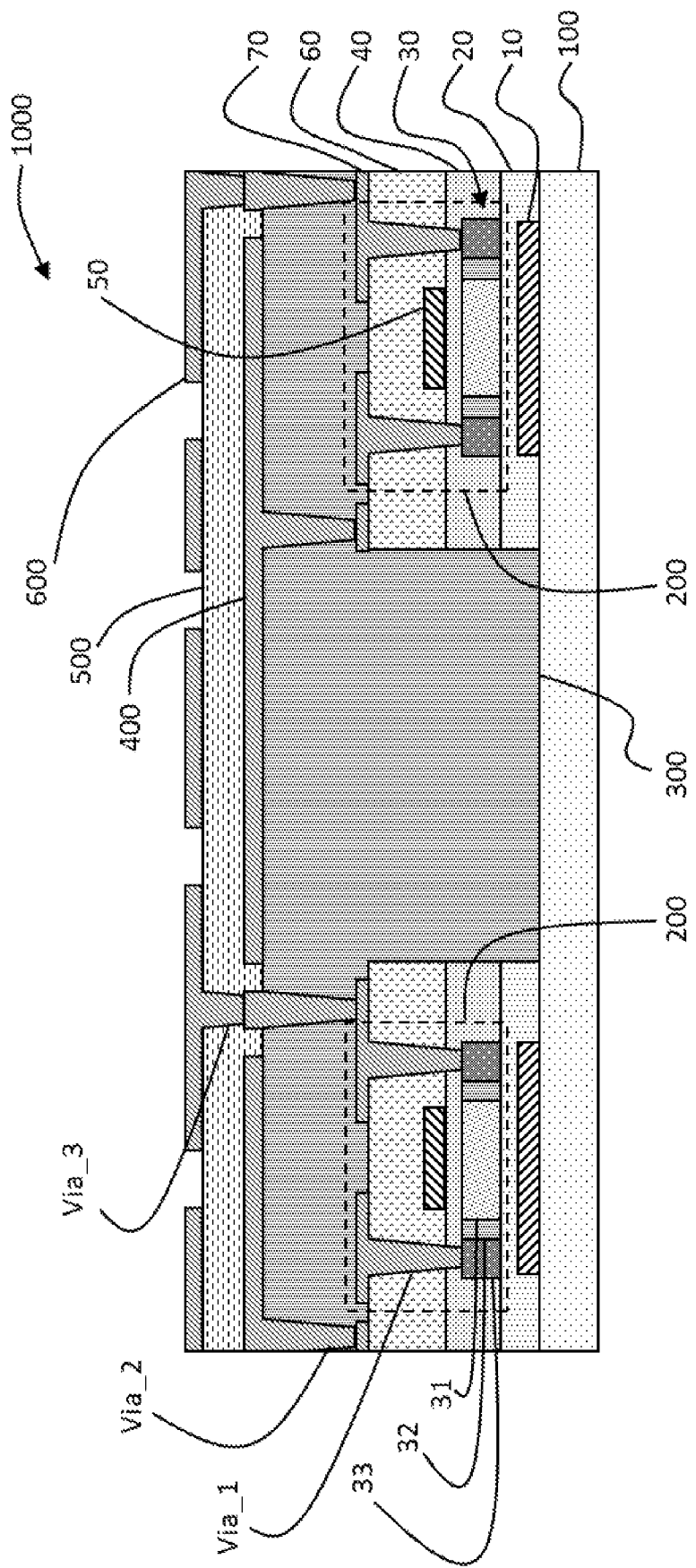
FIG. 1 is a schematic view of a structure of an array substrate according to an embodiment of the present disclosure.

Referring to FIG. 1, one embodiment of the disclosure provides an array substrate 1000 including a substrate 100, a plurality of thin film transistors (TFT) 200 disposed on the substrate 100, and a planarization layer (PLN) 300 covering the plurality of thin film transistors 200 and filled a region defined by the plurality of thin film transistors 200 and the substrate 100.

Referring to FIG. 1, in one embodiment of the disclosure, the plurality of thin film transistors 200 include a molybdenum (Mo) shading layer 10 disposed on the substrate, a buffer layer (BL) 20 covering on the molybdenum shading layer 10, an active layer 30 disposed on the buffer layer 20, a gate insulating layer (GI) 40 covering on the active layer 30, a patterned gate layer 50 disposed on the gate insulating layer 40, an interlayer dielectric (ILD) 60 covering on the patterned gate layer 50, and a source/drain layer 70 disposed on the interlayer dielectric 60 and connected to the active layer 30 by a first through-hole layer Via_1.

Referring to FIG. 1, in one embodiment of the disclosure, the array substrate 1000 further includes a transparent common conductive layer 400 disposed on the planarization layer 300, a passivation layer (PV) 500 disposed on the transparent common conductive layer 400, and transparent pixel electrodes 600 disposed on the passivation layer 500.

In detail, material of the transparent common conductive layer 400 may be indium tin oxide (ITO). Material of the transparent pixel electrodes 600 may be ITO.

In detail, the transparent common conductive layer 400 is electrically connected to the source/drain layer 70 by a second through-hole layer Via_2. The transparent pixel electrodes 600 is electrically connected to the source/drain layer 70 by a third through-hole layer Via_3 and the second through-hole layer Via_2.

Figure 2:
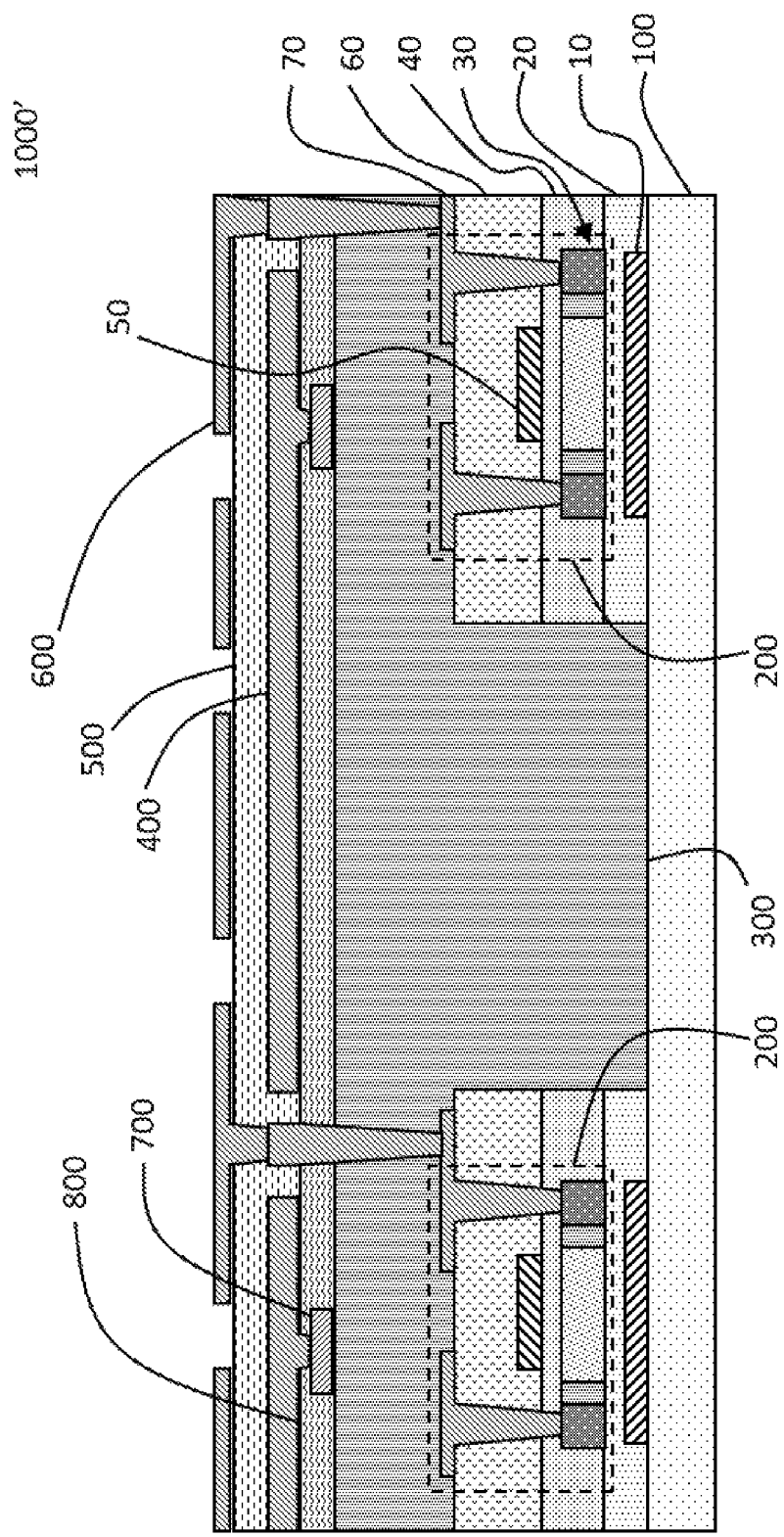
FIG. 2 is a schematic view of a structure of an array substrate according to an embodiment of the present disclosure.

Referring to FIG. 2, in one embodiment of the disclosure, the array substrate 1000' further includes a patterned metallic layer 700 and an insulating layer (IL) 800 disposed between the planarization layer 300 and the transparent common conductive layer 400.

In detail, the patterned metallic layer 700 is disposed above the molybdenum (Mo) shading layer 10 to avoid reducing light transmittance or scattering light.

In detail, the transparent common conductive layer 400 can serve as a common electrode of an in-cell touch panel. There is some distance between the patterned metallic layer 700 and the patterned gate layer 50 to avoid crosstalk of signal.

Referring to FIG. 1, in one embodiment of the disclosure, the active layer 30 includes a poly-silicon layer 31, light doping layers 32 disposed at opposite sides of the poly-silicon layer 31, and heavy doping layers 33 contacted the light doping layers 32.

In detail, the heavy doping layers 33 are used to reduce junction resistance between metallic material of first through-hole layer Via_1 and semiconductor material of the active layer 30. The light doping layers 32 are used to reduce a width of a depletion region between the heavy doping layers 33 and the poly-silicon layer 31.

Figure 3:
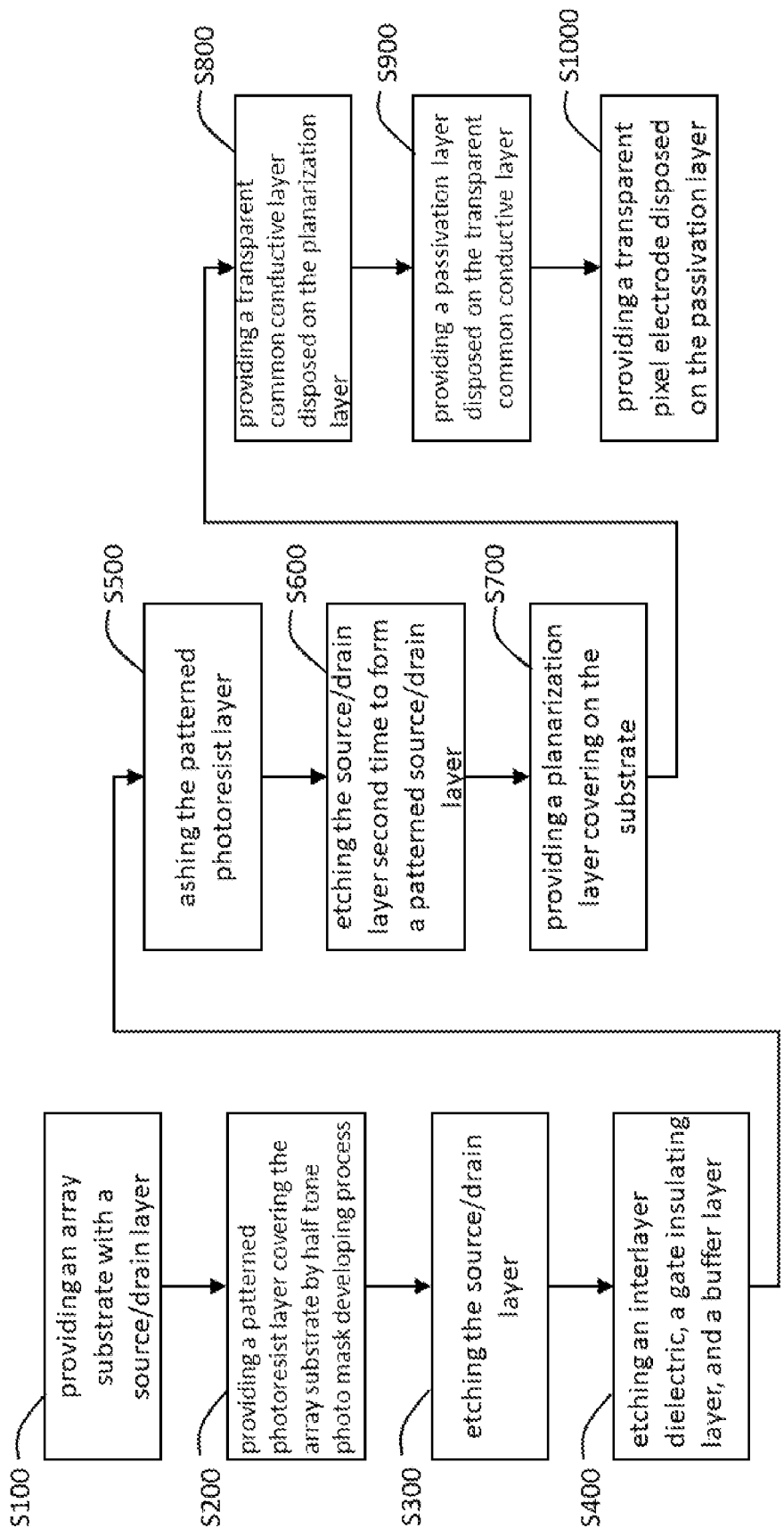
FIG. 3 is a schematic flowchart of a method of manufacturing the array substrate according to an embodiment of the present disclosure.
Figure 6:
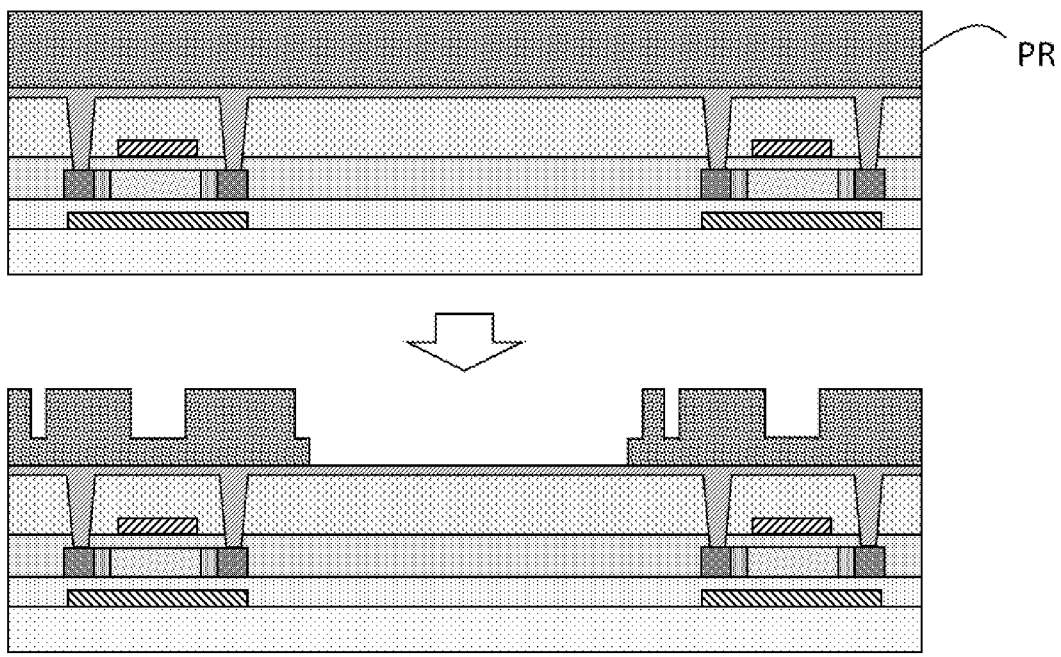
FIG. 6 is a schematic process of a step of providing a patterned photoresist layer covering the array substrate by half tone photo mask developing process according to an embodiment of the present disclosure.

Furthermore, referring to FIG. 3, another embodiment of the disclosure provides a method of manufacturing an array substrate including steps of:

At block S100: providing an array substrate with a source/drain layer;

Referring to FIGS. 3 and 6, at block S200: providing a patterned photoresist (PR) layer covering the array substrate by half tone photo mask developing process;

In detail, half tone photo mask developing process can provide patterned photoresist layer with different depths at the same time.

Figure 7:
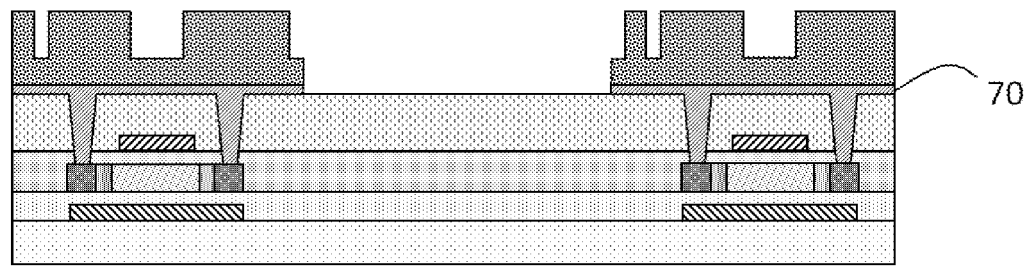
FIG. 7 is a schematic process of a step of etching the source/drain layer according to an embodiment of the present disclosure.
Figure 8:
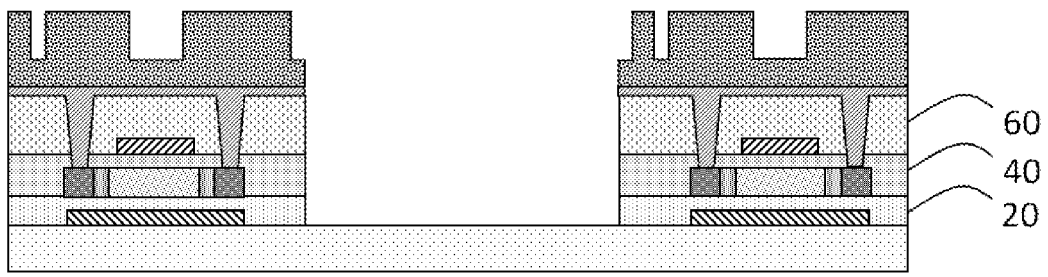
FIG. 8 is a schematic process of a step of etching an interlayer dielectric, a gate insulating layer, and a buffer layer according to an embodiment of the present disclosure.
Figure 9:
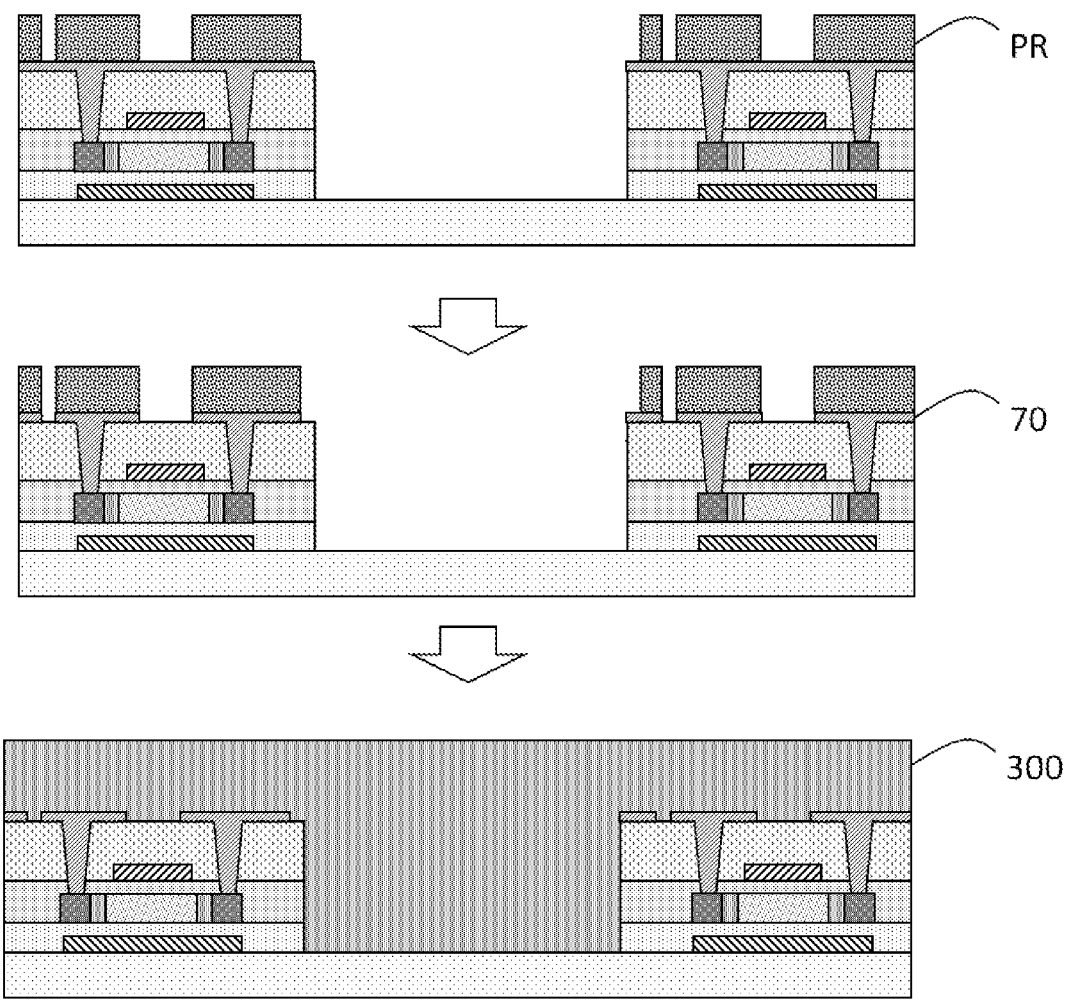
FIG. 9 is a schematic process of a method of manufacturing an array substrate according to an embodiment of the present disclosure.

Referring to FIGS. 3 and 7, at block S300: etching the source/drain layer 70;

Referring to FIGS. 3 and 8, at block S400: etching an interlayer dielectric 60, a gate insulating layer 40, and a buffer layer 20;

Referring to FIGS. 3 and 9, at block S500: ashing the patterned photoresist layer;

At block S600: etching the source/drain layer 70 second time to form a patterned source/drain layer; and At block S700: providing a planarization layer 700 covering on the substrate.

Figure 10:
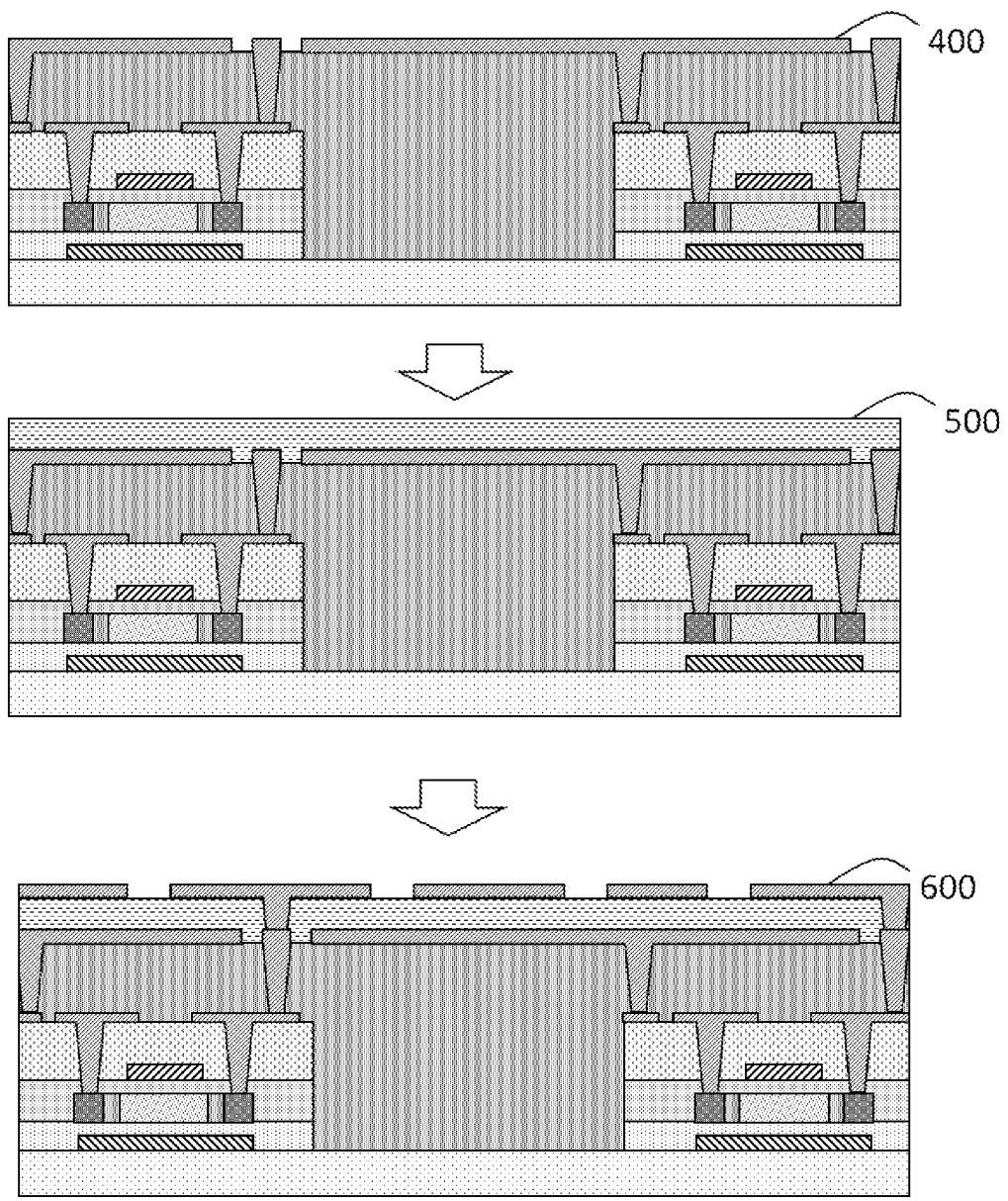
FIG. 10 is a schematic process of a method of manufacturing an array substrate according to an embodiment of the present disclosure.

Referring to FIGS. 3 and 10, in one embodiment of the disclosure, the method of manufacturing the array substrate further includes:

At block S800: providing a transparent common conductive layer 400 disposed on the planarization layer;

At block S900: providing a passivation layer 500 disposed on the transparent common conductive layer 400; and At block S1000: providing a transparent pixel electrode 600 disposed on the passivation layer 500.

Figure 4:
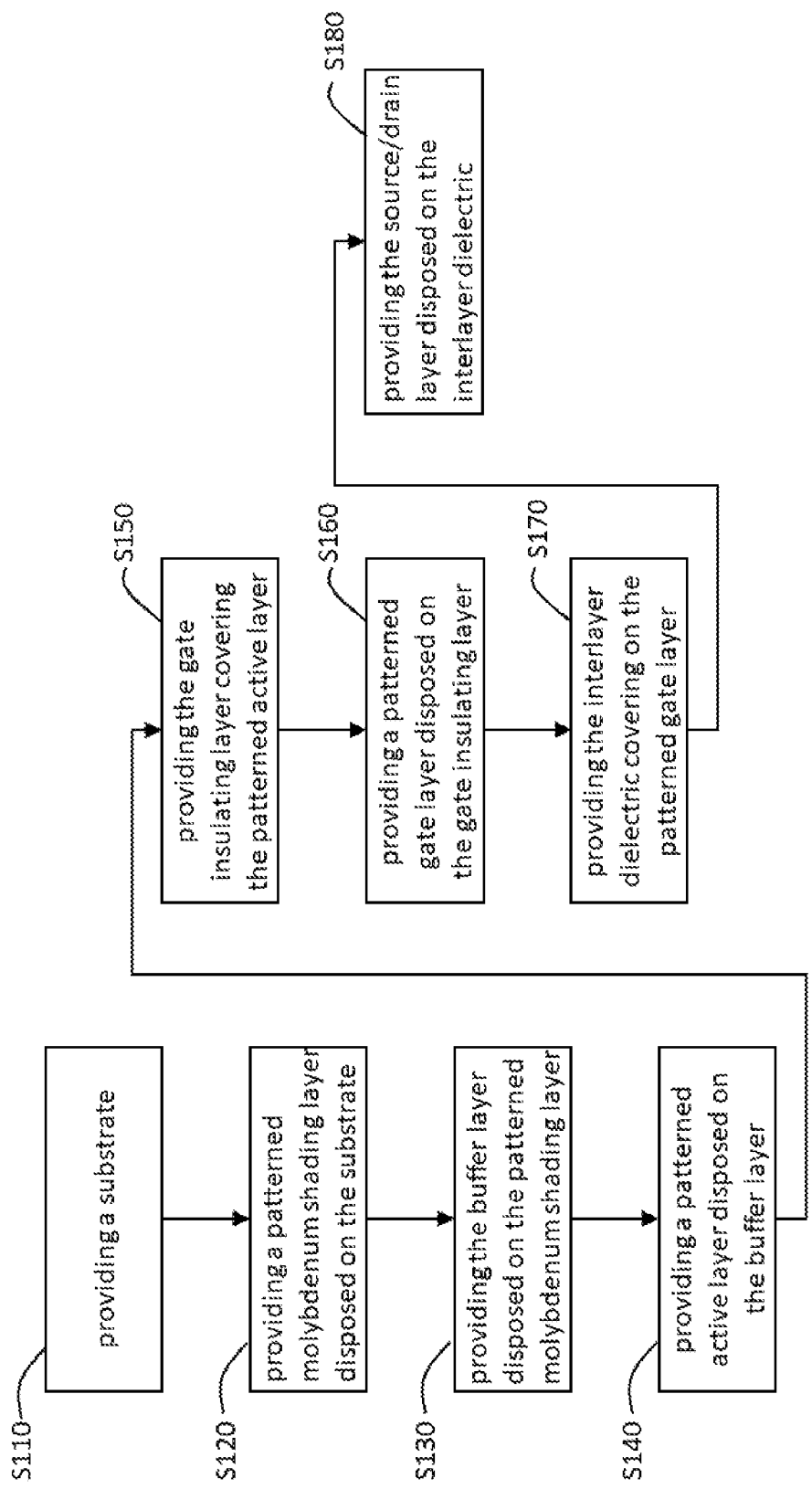
FIG. 4 is a schematic flowchart of a step of providing an array substrate with source/drain layer according to an embodiment of the present disclosure.
Figure 5:
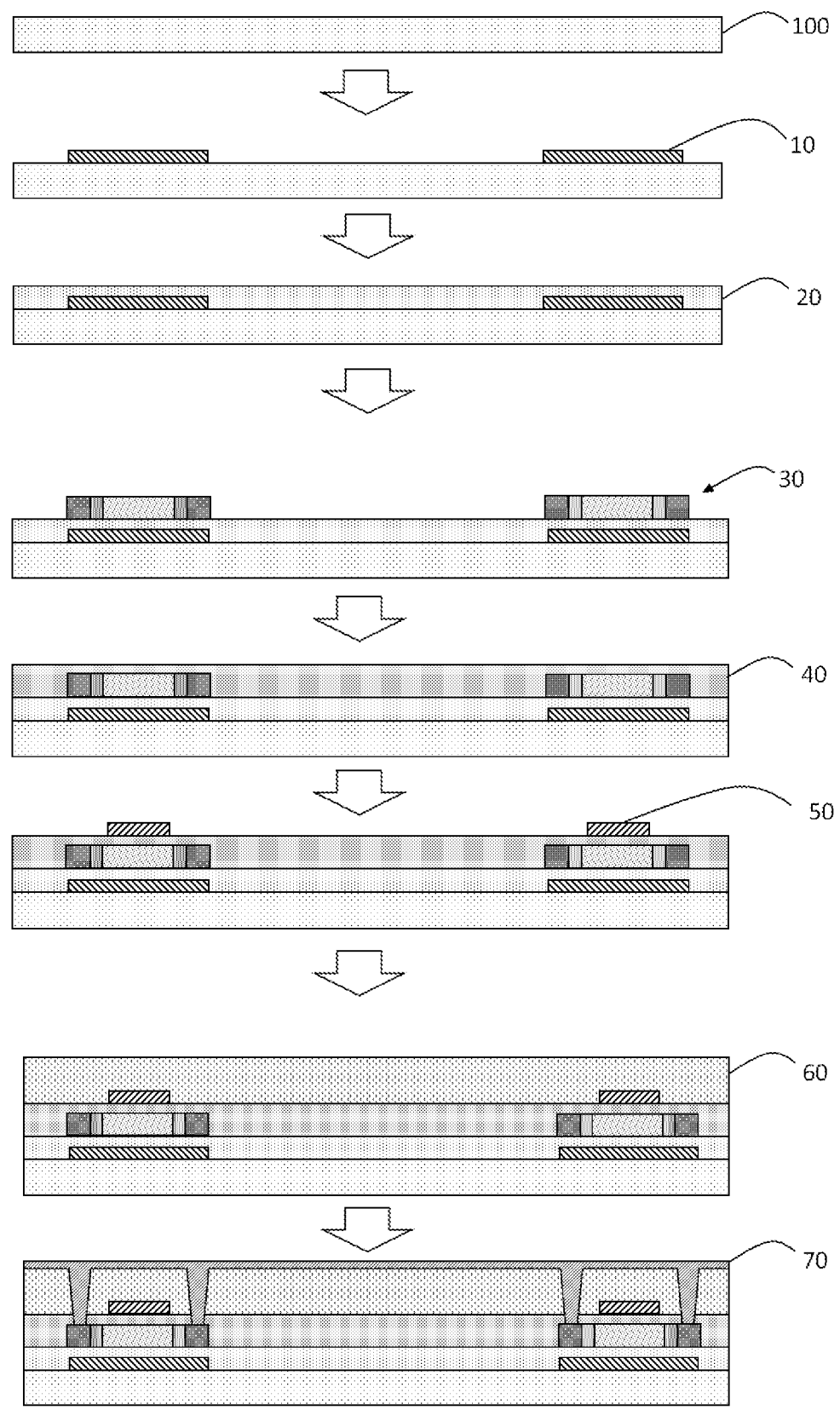
FIG. 5 is a schematic process of a step of providing an array substrate with source/drain layer according to an embodiment of the present disclosure.

Referring to FIGS. 4 and 5, in one embodiment of the disclosure, the step S100 of providing an array substrate with a source/drain layer further includes steps of:

At block S110: providing a substrate 100;

At block S120: providing a patterned molybdenum shading layer 10 disposed on the substrate 100;

At block S130 providing the buffer layer 20 disposed on the patterned molybdenum shading layer 10;

At block S140: providing a patterned active layer 30 disposed on the buffer layer 20;

At block S150: providing the gate insulating layer 40 covering the patterned active layer 30;

At block S160: providing a patterned gate layer 50 disposed on the gate insulating layer 40;

At block S170: providing the interlayer dielectric 60 covering on the patterned gate layer 50; and At block S180: providing the source/drain layer 70 disposed on the interlayer dielectric 60.

In one embodiment of the disclosure, the patterned active layer includes poly-silicon.

Referring to FIG. 1, in one embodiment of the disclosure, the patterned active layer includes a poly-silicon layer, light doping layers disposed at opposite sides of the poly-silicon layer, and heavy doping layers disposed beside the light doping layers respectively.

In detail, the heavy doping layers 33 are used to reduce junction resistance between metallic material of first through-hole layer Via_1 and semiconductor material of the active layer 30. The light doping layers 32 are used to reduce a width of a depletion region between the heavy doping layers 33 and the poly-silicon layer 31.

In comparison with prior art, the array substrate and the method of manufacturing the same of the disclosure reduce light absorption, reflection, refraction, or scattering between layers by filling planarization layer in the region defined by the thin film transistors and the substrate after excavating the buffer layer, the gate insulating layer, and the interlayer dielectric between the thin film transistors and the substrate.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. An array substrate, comprising: a substrate; a plurality of thin film transistors disposed on the substrate; and a planarization layer covering the plurality of thin film transistors and filled a region defined by the plurality of thin film transistors and the substrate; wherein the plurality of thin film transistors comprise: a molybdenum shading layer disposed on the substrate; a buffer layer covering on the molybdenum shading layer; an active layer disposed on the buffer layer; a gate insulating layer covering on the active layer; a patterned gate layer disposed on the gate insulating layer; an interlayer dielectric covering on the patterned gate layer; and a source/drain layer disposed on the interlayer dielectric and connected to the active layer by a first through-hole layer; further comprising: a transparent common conductive layer disposed on the planarization layer; a passivation layer disposed on the transparent common conductive layer; and transparent pixel electrodes disposed on the passivation layer.

2. The array substrate according to claim 1, further comprising a patterned metallic layer and an insulating layer disposed between the planarization layer and the transparent common conductive layer.

3. The array substrate according to claim 1, wherein the active layer comprises: a poly-silicon layer; light doping layers disposed at opposite sides of the poly-silicon layer; and heavy doping layers contacted the light doping layers.

4. A method of manufacturing an array substrate, comprising steps of: providing an array substrate with a source/drain layer; providing a patterned photoresist layer covering the array substrate by half tone photo mask developing process; etching the source/drain layer; etching an interlayer dielectric, a gate insulating layer, and a buffer layer; ashing the patterned photoresist layer; etching the source/drain layer second time to form a patterned source/drain layer; and providing a planarization layer covering on the substrate; wherein the step of providing an array substrate with a source/drain layer further comprises steps of: providing a substrate; providing a patterned molybdenum shading layer disposed on the substrate; providing the buffer layer disposed on the patterned molybdenum shading layer; providing a patterned active layer disposed on the buffer layer; providing the gate insulating layer covering the patterned active layer; providing a patterned gate layer disposed on the gate insulating layer; providing the interlayer dielectric covering on the patterned gate layer; and providing the source/drain layer disposed on the interlayer dielectric.

5. The method of manufacturing the array substrate according to claim 4, further comprising:
providing a transparent common conductive layer disposed on the planarization layer;
providing a passivation layer disposed on the transparent common conductive layer; and
providing a transparent pixel electrode disposed on the passivation layer.

6. The method of manufacturing the array substrate according to claim 4, wherein the patterned active layer comprises poly-silicon.

7. The method of manufacturing the array substrate according to claim 4, wherein the patterned active layer comprises a poly-silicon layer, light doping layers disposed at opposite sides of the poly-silicon layer, and heavy doping layers disposed beside the light doping layers respectively.

8. An array substrate, comprising:
a substrate;
a plurality of thin film transistors disposed on the substrate;
a planarization layer covering the plurality of thin film transistors and filled a region defined by the plurality of thin film transistors and the substrate;
a transparent common conductive layer disposed on the planarization layer;
a passivation layer disposed on the transparent common conductive layer; and
transparent pixel electrodes disposed on the passivation layer, wherein the plurality of thin film transistors comprise:
a molybdenum shading layer disposed on the substrate;
a buffer layer covering on the molybdenum shading layer;
an active layer disposed on the buffer layer;
a gate insulating layer covering on the active layer;
a patterned gate layer disposed on the gate insulating layer;
an interlayer dielectric covering on the patterned gate layer; and
a source/drain layer disposed on the interlayer dielectric and connected to the active layer by a first through-hole layer.

9. The array substrate according to claim 8, further comprising a patterned metallic layer and an insulating layer disposed between the planarization layer and the transparent common conductive layer.

10. The array substrate according to claim 9, wherein the patterned metallic layer is disposed on the molybdenum shading layer.

11. The array substrate according to claim 10, wherein the active layer comprises:
a poly-silicon layer;
light doping layers disposed at opposite sides of the poly-silicon layer; and
heavy doping layers contacted the light doping layers.

* * * * *